United States Patent
Honna

[19]

[11] Patent Number: 6,031,266
[45] Date of Patent: Feb. 29, 2000

[54] SEMICONDUCTOR DEVICE WITH CONDUCTIVE SIDEWALL FILM

[75] Inventor: Katsu Honna, Kawasaki, Japan

[73] Assignee: Kabushiki Kaisha Toshiba, Kawasaki, Japan

[21] Appl. No.: 08/966,803

[22] Filed: Nov. 10, 1997

[30] Foreign Application Priority Data

Nov. 11, 1996 [JP] Japan ................................. 8-298336

[51] Int. Cl.⁷ ............................................. H01L 27/088
[52] U.S. Cl. ........................ 257/336; 257/344; 257/408; 257/900
[58] Field of Search ............................... 257/408, 344, 257/336, 900

[56] References Cited

U.S. PATENT DOCUMENTS 4,971,922  11/1990  Watabe et al. .......................... 437/44
5,091,763   2/1992  Sanchez ................................ 357/23.9
5,132,758   7/1992  Minami et al. ........................ 357/23.4
5,831,319  11/1998  Pan ....................................... 257/408

*Primary Examiner*—William Mintel
*Attorney, Agent, or Firm*—Finnegan, Henderson, Farabow, Garrett & Dunner, L.L.P.

[57] ABSTRACT

In the MOS FET semiconductor device having a LDD structure, a polysilicon layer of which a side wall film is formed is provided, the polysilicon layer is made conductive by doping an impurity by ion-implantation. The side wall film of conductive polysilicon can be used as a wiring by applying voltages to the end portions of the side wall film. The side wall film can be used not only as a wiring, but also as a resistor layer. The side wall film may be formed on the side surface of a resistor layer. The side wall film can be used as a wiring by doping impurity into the side wall film by ion-implantation so as to make the side wall film conductive. By virtue of these structures, the semiconductor chip in the semiconductor device can be reduced in size.

6 Claims, 4 Drawing Sheets

SEMICONDUCTOR DEVICE WITH CONDUCTIVE SIDEWALL FILM

BACKGROUND OF THE INVENTION

This invention relates to a semiconductor device having a side wall film and a method of manufacturing the same.

The conventional semiconductor device will be described below with reference to the drawings. FIG. 7 is a sectional view of the conventional semiconductor device, and FIG. 8 is a plan pattern view of the conventional semiconductor device.

At first, an oxide film is formed over the surface of a semiconductor substrate 101. A portion of the oxide film is further oxidized to form a field oxide film 102, so that the surface region of the semiconductor device is electrically divided into an element forming region and an element isolating region. Next, a polysilicon layer is formed over the surface of the semiconductor substrate, and patterned, using a photolithography process, with use of a mask having a predetermined pattern to form a gate electrode 103 on the element forming region.

Subsequently, ion implantation is performed to dope the element forming region with impurity by using the gate electrode 103 and the field oxide film 102 as a mask in order to form a lightly doped drain region (hereinafter referred to as a "LDD region") 104.

Next, an oxide film 105 is formed over the surface of the semiconductor substrate, that is, on the gate electrode 103, the field oxide film 102, and the semiconductor substrate 101. Subsequently, polysilicon is deposited over the surface of the semiconductor substrate, and then the polysilicon film is etched to form a polysilicon side wall film 106 on the side surface of the gate electrode 103 with the oxide film 105 therebetween.

Next, in order to form source and drain regions 107 and 108 having a high impurity-concentration, the element forming region is doped with impurity by using ion implantation, with the field oxide film 102, the gate electrode 103, and the side wall film 106 as a mask.

Then, an interlayer insulating film 109 is formed over the surface of the semiconductor substrate having the above-mentioned structure thereon. Subsequently, portions of the interlayer insulating film 109 on the source and drain regions 107 and 108 are removed using photolithography to form contact holes 110 and 111 which communicate with the source and drain regions 107 and 108, respectively. Next, a further portion of the interlayer insulating film 109 on an end portion of the extending portion of the gate electrode 103 is also removed to form in the interlayer insulating film 109 a contact hole 112 communicating with the end portion of the gate electrode 103. Then, a metal film is formed by vapor-depositing a metal such as Al over the surface of the semiconductor device. The metal film is then patterned to form metal wirings 113 and 114, which contact the source and drain regions 107 and 108, and the end portion of the gate electrode 103 (shown in FIG. 8) via the contact holes 110, 111, and 112. This step completes the manufacturing process of the conventional semiconductor device.

The polysilicon side wall film 106 formed on the side portion of the gate electrode 103 of the conventional MOS FET (Metal Oxide Semiconductor Field Effect Transistor) is used merely as a mask when the source and drain regions 107 and 108 of the semiconductor device having the LDD structure are formed, and is not used after the LDD structure has been formed.

Simultaneously with the forming of the above-mentioned side wall film of the MOS FET in the semiconductor integrated circuit, a polysilicon side wall film is sometimes formed on the side surface of a resistor layer formed in the same semiconductor integrated circuit. The side wall film on the resistor, however, is incidental, and removal of the side wall film is required. Because an additional manufacturing step is required, the manufacturing process becomes complicated.

BRIEF SUMMARY OF THE INVENTION

The present invention has been developed in view of the above-mentioned circumstances, and intends to provide a semiconductor device and the manufacturing method, wherein a semiconductor chip is reduced in size by positively using the side wall film which is obtained in the forming of the LDD structure.

The above-mentioned object of the present invention is attained by a semiconductor device comprising: a semiconductor substrate; a gate electrode formed on a surface of the semiconductor substrate with a gate insulation film therebetween; an insulating film formed over the gate electrode; a conductive side wall film having a first portion formed on a side surface of the gate electrode with the insulating film therebetween and second portions forming opposite end portions extending from the first portion; LDD regions formed in portions of the surface region of the semiconductor substrate, which portions are located below the insulating film and the side wall film; and source and drain regions formed in the surface regions of the semiconductor substrate, adjacent to the LDD regions.

It is preferable that the side wall film is used as a wiring. Alternatively, it is preferable that the side wall film is used as a resistor. It is also preferable that the side wall film have a potential different from that of the gate electrode.

It is further preferable that the side wall film is formed of polysilicon. Alternatively, it is also preferable that the side wall film is formed of amorphous silicon.

The above-mentioned object of the present invention is also attained by a method of manufacturing a semiconductor device comprising the steps of: forming a gate electrode on a gate insulation film on an element forming region of a semiconductor substrate; forming LDD regions in the element forming region by doping an impurity into the element forming region with use of the gate electrode as a mask; forming an insulating film over the gate electrode; forming a polysilicon layer to cover the insulating film; patterning the polysilicon layer to form a polysilicon side wall film having a first portion on the side surface of the gate electrode with the insulating film therebetween and second portions forming opposite end portions extending from the first portion; forming source and drain regions in the element forming region of the semiconductor substrate by doping an impurity into the element forming region with use of the gate electrode, the insulating film, and the polysilicon side wall film as a mask.

It is preferable to comprise a further step, after the polysilicon layer forming step, of doping an impurity into the polysilicon layer covering the insulating film.

It is also preferable to add a further step, after the source and drain regions forming step, of forming an interlayer insulating film over the surface of the semiconductor substrate and forming in the interlayer insulating film contact holes communicating with the end portions of the polysilicon side wall film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The following is the description of a semiconductor device and a manufacturing method of the same according to a first embodiment of the present invention.

Figure 1:
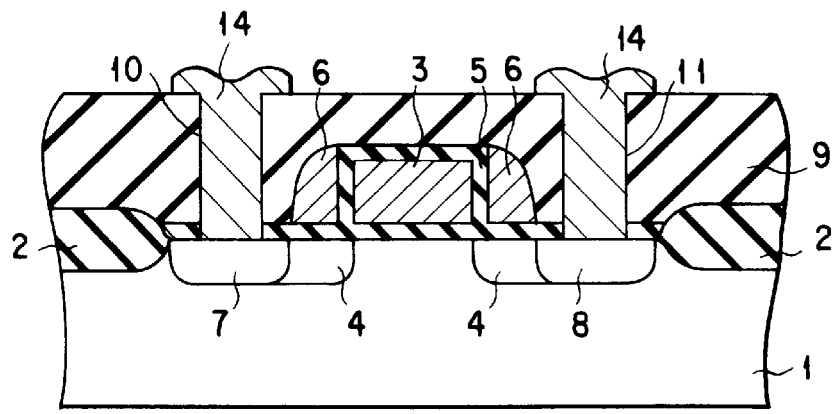
FIG. 1 is a sectional view of the semiconductor device according to a first embodiment of the present invention, which is taken along a line I—I shown in FIG. 2.
Figure 2:
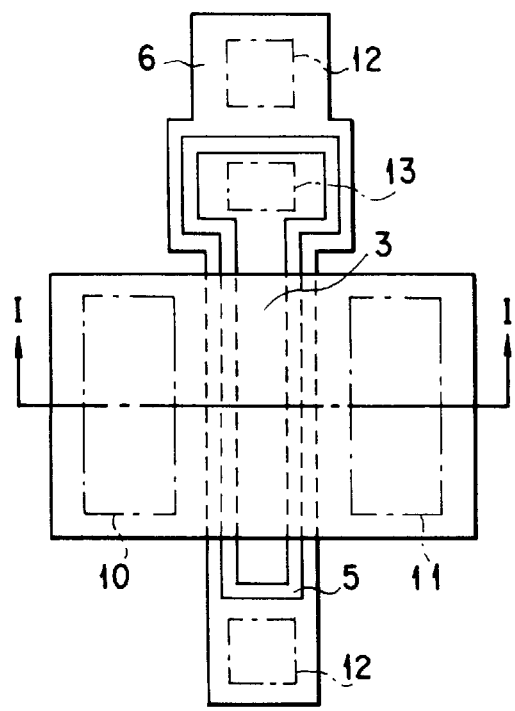
FIG. 2 is a plan pattern view of the semiconductor device according to the first embodiment of the present invention.

The semiconductor device according to the first embodiment of the present invention will be described with reference to FIGS. 1 and 2. FIG. 1 is a sectional view of the semiconductor device according to the first embodiment of the present invention, which is taken along a line I—I shown in FIG. 2. FIG. 2 is a plan pattern view of the semiconductor device according to the first embodiment of the present invention shown in FIG. 1.

In the semiconductor device according to the first embodiment of the present invention, an element forming region is defined by forming a field oxide film in an element isolation region on the surface region of a semiconductor substrate 1. The element forming region is provided with a gate electrode 3 formed thereon. An oxide film 5 is formed over the gate electrode 3. A polysilicon layer is then formed over the semiconductor substrate having the above-mentioned structure thereon, and then an impurity such as phosphorus is doped into the polysilicon layer to make the polysilicon layer conductive. Subsequently, the polysilicon layer is etched to form a side wall film 6 of polysilicon on the side surface of the gate electrode 3 with the oxide film 5 therebetween. The side wall film 6 further comprises end portions extending from the side wall portion, as shown in FIG. 2. Source and drain regions 7 and 8 of a LDD structure are then formed in the surface region of the semiconductor substrate 1, by doping an impurity with use of the gate electrode 3 and the polysilicon side wall film 6 as a mask. An interlayer insulating film 9 is formed over the semiconductor substrate having such a structure thereon. The interlayer insulating film 9 is etched to be removed at the portions thereof on the source and drain regions 7 and 8, on the extending end portions of the polysilicon side wall film 6, and on the extending end portion of the gate electrode 3. By etching the interlayer insulating film in this manner, contact holes 10, 11, 12, and 13 communicating with the source and drain regions 7 and 8, the extending end portions of the side wall film 6, and the extending end portion of the gate electrode are formed in the interlayer insulating film 9. Metal wirings 14 are formed by vapor-depositing a metal film over the semiconductor substrate having such a structure and patterning the deposited metal film.

The polysilicon side wall film 6 can be used as a wiring by making the polysilicon side wall film 6 conductive and applying voltages at both the end portions thereof. In the conventional logic device, many wirings have been used in order to reduce the wiring length. According to the present invention, a second wiring layer of the conventional device can be substituted by the wiring of the side wall film, and thus the semiconductor chip can be reduced in thickness by one wiring layer.

Further, in forming the conventional multilayered metal wiring, the planarization of the first metal wiring layer has been strictly required. According to the present invention, the second wiring layer can be substituted by the side wall film. In addition, the side wall film 6 is formed prior to the forming of the first wiring layer. The semiconductor device of the present invention can be formed without considering the breakage of the wiring which may occur in the conventional device due to the difference in height level of the first wiring layer.

The following is the description of a semiconductor device manufacturing method according to the first embodiment of the present invention, with reference to FIGS. 3A–3E. FIGS. 3A–3E show sectional views of a semiconductor device in the steps of the manufacturing process according to the first embodiment of the present invention.

Figure 3A:
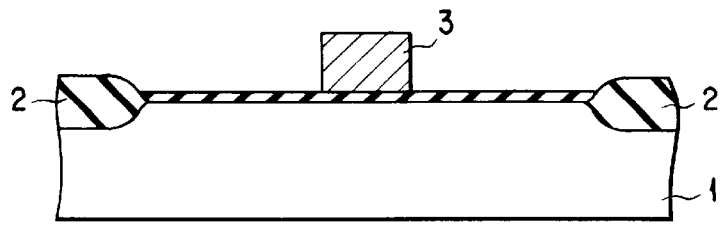
FIGS. 3A through 3E are sectional views of the semiconductor device during the manufacturing process according to the first embodiment of the present invention.

As shown in FIG. 3A, the oxide film is formed over the semiconductor substrate 1. Subsequently, a portion of the oxide film, which corresponds to the element isolating region, is further oxidized to form the field oxide film 3 in the element isolating region, and accordingly to define the element forming region. Next, a polysilicon layer having a thickness of about 350 nm is formed over the upper surface of the semiconductor substrate 1 having the above-mentioned structure, and then etched with use of a mask to form the gate electrode 3 of polysilicon in the element forming region. The gate electrode 3 also comprises an extending end portion, as shown in FIG. 2.

Figure 3B:
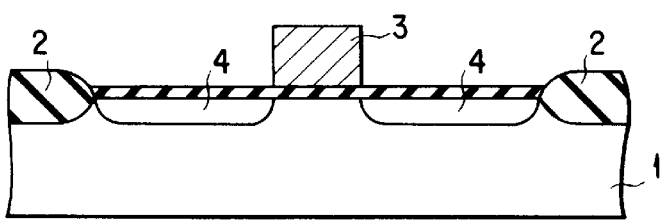

Subsequently, LDD regions 4 are formed by doping phosphorous by about $1 \times 10E\ 13$ atoms/cm$^2$ into the element forming region with use of the field oxide film 2 and the gate electrode 3 as a mask, as shown in FIG. 3B.

Figure 3C:
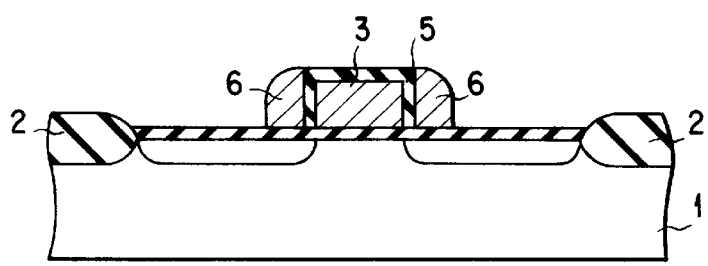

As shown in FIG. 3C, the oxide film 5 is then formed over the upper surface of the semiconductor substrate 1 having such a structure thereon. Next, the polysilicon layer having a thickness of about 100 nm is formed and then made conductive by doping phosphorous by about $1 \times 10E\ 16$ atoms/cm$^2$. Thereafter, the polysilicon layer is etched to form the side wall film 6 of polysilicon on the side surface of the gate electrode 3. The side wall film 6 also comprises extending end portions, as shown in FIG. 2.

Figure 3D:
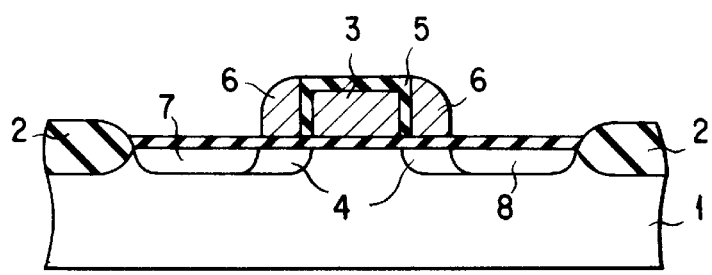

Then, the source and drain regions 7 and 8 are formed in the element forming region by doping arsenic by about 1×10E 15 atoms/cm$^2$ into the element forming region with use of the field oxide film 2, the gate electrode 3, and the side wall film 6 as a mask, as shown in FIG. 3D.

Figure 3E:
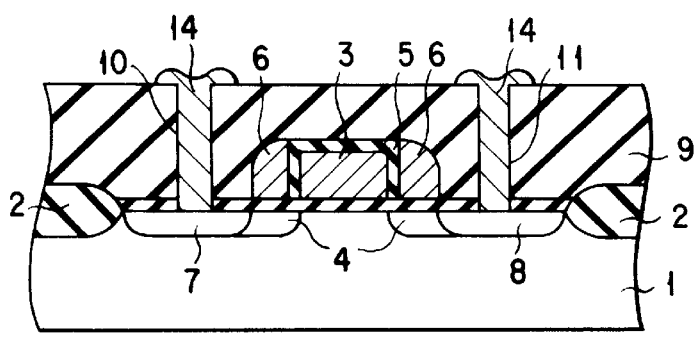

As shown in FIG. 3E, the interlayer insulating film 9 is then formed over the upper surface of the semiconductor substrate. Thereafter, the interlayer insulating film 9 is etched to form the contact holes 10, 11, and 12 communicating with the source and drain regions 7, 8, and the extending end portions of the side wall film 6 (see FIG. 2) in the interlayer insulating film 9. At this time, the contact hole 13 (FIG. 2) communicating with the extending end portion of the gate electrode 3 (FIG. 2) is also formed in the interlayer insulating film 9. Subsequently, a film of a metal such as Al is vapor-deposited over the surface of the semiconductor substrate, then the vapor-deposited metal film is patterned to form the metal wirings 14. The metal wirings extend through the contact holes 10, 11, 12, and 13 to contact with the source and drain regions 7, 8, extending end portions of the side wall film 6, and the extending end portion of the gate electrode 3. By performing the above-mentioned steps, the semiconductor device according to the first embodiment of the present invention, as shown in FIGS. 1 and 2 can be obtained.

As described above, the semiconductor device according to the present embodiment can be obtained, in addition to the manufacturing steps of the conventional semiconductor device, merely by performing the additional step of doping the impurity into the polysilicon layer when the side wall film 6 is formed, by changing the pattern of the side wall film 6, and by changing the pattern of the contact holes formed in the interlayer insulating film 9.

The present invention is not limited to the first embodiment described above. For example, the doping step of doping the impurity into the polysilicon layer patterned into the side wall film 6 may be omitted. Instead, impurity may be doped into the side wall film 6 in order to make it conductive in the same doping step in which impurity is doped into the element forming region to form the source and drain regions 7 and 8. By forming the side wall film in this manner, the same semiconductor device as described above can be obtained without increasing the manufacturing steps in number.

The semiconductor device of the present invention is not limited to the NMOS type device as described above, but PMOS, CMOS, and BiCMOS types of semiconductor device also have the same effect as that of the NMOS type device.

Figure 4:
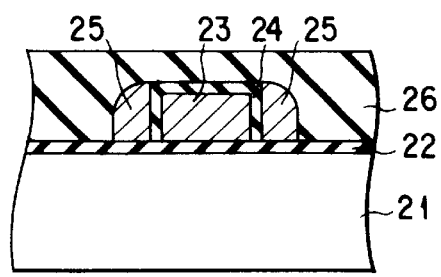
FIG. 4 is a sectional view of the semiconductor device according to a second embodiment of the present invention, which is taken along a line IV—IV shown in FIG. 5.
Figure 5:
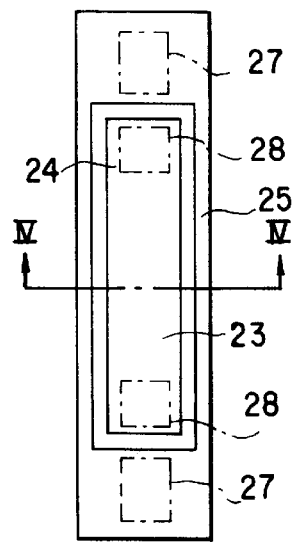
FIG. 5 is a plan view of the semiconductor device according to the second embodiment of the present invention.

Next, a semiconductor device and a manufacturing method according to a second embodiment of the present invention will be described below with reference to FIGS. 4 and 5. FIG. 4 is a sectional view of the semiconductor device according to the second embodiment of the present invention. FIG. 5 is a plan pattern view of the semiconductor device according to the second embodiment of the present invention.

The semiconductor device according to the second embodiment of the present invention comprises an oxide film 22 formed over a semiconductor substrate 21; a resistor layer 23 of polysilicon formed on the oxide film 22; a conductive side wall film 25 formed on a side surface of the resistor layer 23 with insulating films 24 therebetween; an interlayer insulating film 26 formed over the surface of the semiconductor substrate having the above-mentioned structure in which, contact holes 27 and 28 are formed on extending end portions of the side wall film 25 and on end portions of the resistor layer 23; and metal wirings (not shown) formed by patterning a metal film so as to contact with the side wall film 25 and the resistor layer 23 via the contact holes 27 and 28, respectively.

Similarly to the first embodiment, the side wall film 25 can be used as a wiring by applying a bias voltage to both end portions of the side wall film 25 via the metal wirings (not shown) formed in the contact holes 27.

Figure 6A:
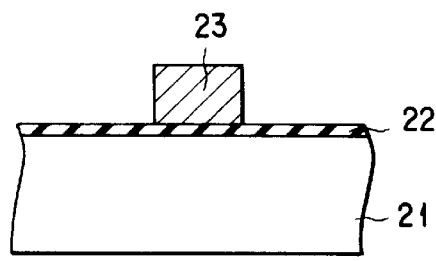
FIGS. 6A through 6C are sectional views of the semiconductor device during the manufacturing process according to the second embodiment of the present invention.
Figure 6B:
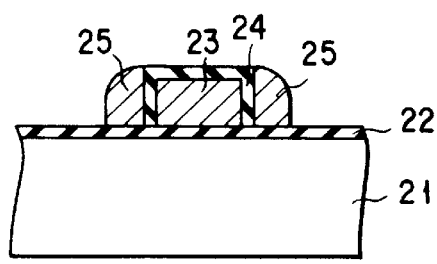
Figure 6C:
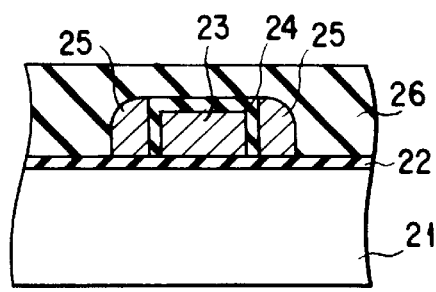
Figure 7:
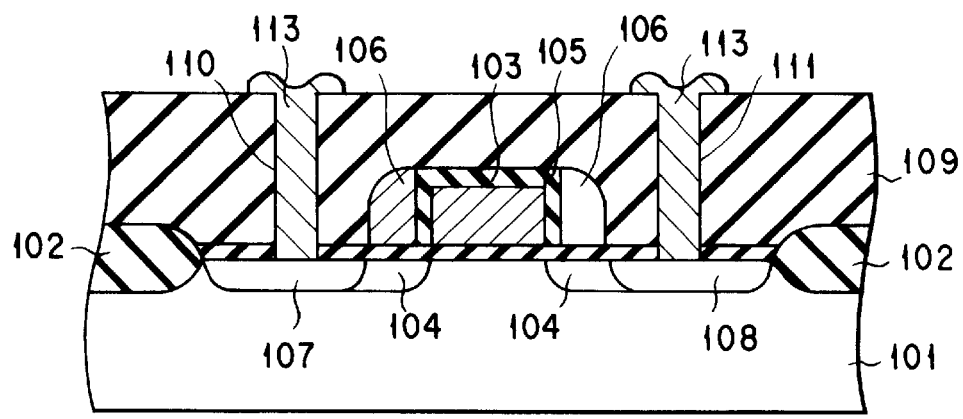
FIG. 7 is a sectional view of the conventional semiconductor device taken along a line VII—VII shown in FIG. 8.
Figure 8:
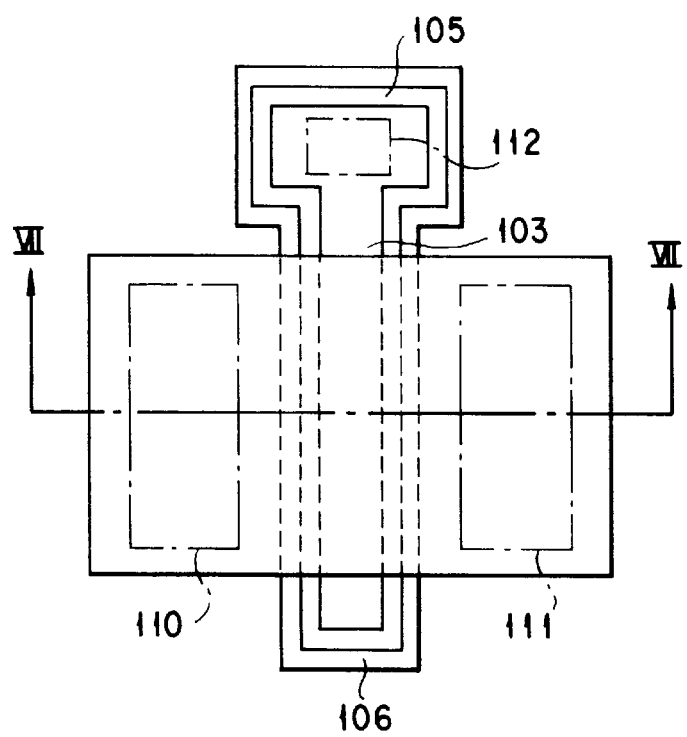
FIG. 8 is a plan pattern view of the conventional semiconductor device shown in FIG. 7.

A semiconductor device manufacturing method according to the second embodiment of the present invention will be described below with reference to FIGS. 6A–6C. FIGS. 6A–6C show sectional views of a semiconductor device in the steps of the manufacturing process according to the second embodiment of the present invention.

As shown in FIG. 6A, the oxide film 22 is formed over the surface of a semiconductor substrate 21. Next, the polysilicon layer having a thickness of about 350 nm is formed over the top surface of the semiconductor substrate 21 having the above-mentioned structure, and then etched with use of a mask to form a resistor layer 23 in the element forming region.

Subsequently, an oxide film 24 is formed over the semiconductor substrate 21 having the above-mentioned structure. Subsequently, the polysilicon layer having a thickness of about 100 nm is formed by deposition over the upper surface of the semiconductor substrate 21 having the above-mentioned structure. The polysilicon layer is doped with phosphorous by 1×10E 10 atoms/cm$^2$ through 1×10E 16 atoms/cm$^2$ to be made conductive. Subsequently, the polysilicon layer is etched to remove selected portions thereof so that the side wall film 25 of polysilicon is formed on the side surface of the resistor layer 23 with the oxide film 24 therebetween. The side wall film 25 comprises extending end portions of polysilicon, as shown in the plan pattern view of FIG. 5.

The interlayer insulating film 26 is then formed over the upper surface of the semiconductor substrate as shown in FIG. 6C. Thereafter, the interlayer insulating film 26 is etched to form contact holes 27 communicating with the extending end portions of the side wall film 25 (see FIG. 5) in the interlayer insulating film 26. In this time, contact holes 28 communicating with the extending end portions of the resistor layer 23 are also formed in the interlayer insulating film 26, by removing portions of the interlayer insulating film 26 on the extending end portions (see FIG. 5) of the resistor layer 23. Subsequently, a metal such as Al is vapor-deposited over the upper surface of the semiconductor substrate having the above-mentioned structure, the vapor-deposited metal film thus formed is patterned to form metal wirings in the contact holes 27 and 28. By performing the above-mentioned steps, the semiconductor device according to the second embodiment of the present invention can be obtained.

The side wall film 25 of the semiconductor device according to the second embodiment of the present invention may be simultaneously formed with a side wall film on the gate electrode of the MOS semiconductor device formed on the same semiconductor substrate, and therefore the manufacturing step is simplified.

In addition, similarly to the first embodiment, the side wall film 25 on the resistor layer 23 can be doped with impurity to be made conductive, simultaneously with the doping of the impurity into the source and drain regions of the MOS semiconductor device formed on the same semiconductor substrate.

The present invention is not limited to the first and second embodiments. For example, the side wall film can be used as a resistor layer.

The side wall film can be formed of not only polysilicon but amorphous silicon.

According to the present invention, the side wall film can be used as a wiring or a resistor by making the side wall film of the gate electrode or the resistor layer conductive and applying voltages to the side wall film. Therefore, the space for forming the wirings increases in the device. The metal wiring layers can be reduced in number. As a result, the semiconductor device which is remarkably reduced in the semiconductor chip size and the manufacturing method can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:
   a semiconductor substrate;
   a gate electrode formed on a surface region of the semiconductor substrate with a gate insulation film therebetween;
   source and drain regions formed in the surface region of the semiconductor substrate;
   an insulating film formed over the gate electrode;
   a conductive side wall film having a first portion formed on a side surface of the gate electrode with the insulating film therebetween and second portions extending along the source and drain regions;
   LDD regions formed in portions of the surface region of the semiconductor substrate, which portions are located below the conductive side wall film and adjacent to the source and drain regions; and
   a pair of electrodes formed on opposite end portions of the second portion of the conductive side wall film.

2. A semiconductor device according to claim 1, wherein the side wall film is used as a wiring.

3. A semiconductor device according to claim 1, wherein the side wall film is used as a resistor.

4. A semiconductor device according to claim 1, wherein the side wall film has a potential applied thereto different from that applied to the gate electrode.

5. A semiconductor device according to claim 1, wherein the side wall film is formed from polysilcon.

6. A semiconductor device according to claim 1, wherein the side wall film is formed from amorphous silicon.

* * * * *